(12) United States Patent
Morikazu

(10) Patent No.: US 7,629,229 B2
(45) Date of Patent: Dec. 8, 2009

(54) LASER PROCESSING METHOD

(75) Inventor: Hiroshi Morikazu, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/363,318

(22) Filed: Jan. 30, 2009

(65) Prior Publication Data
US 2009/0197351 A1 Aug. 6, 2009

(30) Foreign Application Priority Data
Feb. 6, 2008 (JP) ............................. 2008-026737

(51) Int. Cl.
*H01L 21/46* (2006.01)
(52) U.S. Cl. .................. 438/460; 438/458; 438/463
(58) Field of Classification Search .............. 438/458, 438/460, 462, 463, 464, 465, 113, 114
See application file for complete search history.

(56) References Cited
U.S. PATENT DOCUMENTS
7,169,687 B2 * 1/2007 Li et al. ..................... 438/463
7,544,590 B2 * 6/2009 Watanabe .................. 438/463
7,549,560 B2 * 6/2009 Nagai et al. ................ 438/460

FOREIGN PATENT DOCUMENTS
JP  A 10-305420  11/1998

* cited by examiner

Primary Examiner—Kevin M Picardat
(74) Attorney, Agent, or Firm—Greer, Burns & Crain, Ltd.

(57) ABSTRACT

In a laser beam processing method, when a laser beam is emitted along a second predetermined dividing line to form a second groove intersecting a first groove previously formed, the power output of the laser beam is allowed to be a first power output in a first interval, that is, until the second predetermined dividing line reaches a position immediately before the first groove. In a second interval from the position close to the first groove to the first groove reached by the second predetermined dividing line, the power output of the laser beam is set to a second power output lower than the first power output. Thus, overheat on the periphery of the second interval can be suppressed.

3 Claims, 7 Drawing Sheets

LASER PROCESSING METHOD

BACKGROUND OF THE INVENTION

1. Field of the Invention

The present invention relates generally to a laser processing method of forming linear grooves by irradiating a thin-plate material such as e.g. a semiconductor wafer or the like with a laser beam. In particular, the invention relates to a laser processing method suitable for the case where grooves to be formed are intersected with each other.

2. Description of the Related Art

In the chip manufacturing step of a semiconductor device, the front surface of a generally disklike semiconductor wafer is sectioned into a large number of rectangular chip areas by predetermined dividing lines arranged in a lattice-like pattern. Electric circuits such as ICs, LSIs or the like are formed on the chip areas. Thereafter, the wafer is subjected to necessary processing such as rear surface grinding, etc., and then, the wafer is dividedly cut along the predetermined dividing lines, that is, is subjected to dicing, to provide the chip areas as semiconductor chips. The semiconductor chips thus obtained are packaged through resin encapsulation and widely used in various electric or electronic devices such as mobile phones, PC (personal computers) and the like.

Dicing means for dividing a wafer into individual semiconductor chips is heretofore generally blade dicing in which a disklike thin blade is rotated at high-speed and cut into the wafer. The blade dicing is said to have an advantage of providing a flat and sharp cutting surface. However, the predetermined dividing line between the chips needs to have a width greater than a size corresponding to the thickness (mainly about 10 to 30 μm) of the blade used. The necessity makes the cutting margin relatively large. Thus, the blade dicing is said to be disadvantageous in view of providing the number of chips per wafer as many as possible to improve productivity.

On the other hand, laser dicing has recently been adopted to subject a wafer to dicing by directing a laser beam capable of passing therethrough along a predetermined dividing line. Japanese Patent Laid-open No. Hei 10-305420 discloses a technology in which the wafer is irradiated from the front surface with a laser beam along a predetermined dividing line to form a groove and next cleaved along the groove thus formed, thereby providing chips. The formation of the groove by the removal of the front side of the wafer along the predetermined dividing line is due to the fact that the component of the wafer is heated by the laser beam irradiation to cause a thermal evaporation phenomenon called ablation. The laser dicing is said to be advantageous in view of productivity because a cutting margin is significantly smaller than that of the blade dicing.

In the dicing of a wafer, for example, respective grooves are usually formed in all predetermined dividing lines (first predetermined dividing lines) extending in one direction as described in the above-mentioned patent document. Next, respective second grooves are formed in second predetermined dividing lines perpendicular to the first predetermined dividing lines. Thus, the laser dicing will cause a state where a laser beam directed along the second predetermined dividing line is allowed to perpendicularly intersect the first groove formed in the first predetermined dividing line. In this state, a portion, of the diced chip, immediately before the laser beam directed along the second predetermined dividing line reaches the first groove is influenced by overheat comparatively different from those of other large portions in some cases.

As shown in FIG. 7, examples of such an influence by the overheat include deformation in which the width of a portion immediately before a second groove G2 reaches a first groove G1 is enlarged so that respective corners of chips 3 on both sides of the second groove G2 are each not be formed at a right angle. In FIG. 7, an arrow indicates the traveling direction of the laser beam directed to the second predetermined dividing line. In addition, the corner not formed at a right angle becomes fragile to lower bending strength, which may cause a crack or damage in some cases. Further, such a corner has an influence on the easiness of picking up each chip 3 after the completion of dicing.

The easiness of pickup is explained. When the wafer is diced, to handle a wafer hard to be transferred, the wafer is affixed to a dicing tape and a dicing frame affixed to the dicing tape is handled. After completion of the dicing, chips are peeled off from the dicing tape and picked up. In this case, if having higher peel property, the dicing tape is preferably peeled with ease. Because of this, the dicing tape uses a UV (ultraviolet) cure adhesive, and when the chip is picked up, the dicing tape is irradiated with ultraviolet to lower the adherence of the adhesive, thus making pickup easy.

However, during the dicing, the portion immediately before the laser beam directed along the second predetermined dividing line may be overheated as described above. In such a case, the ultraviolet cure adhesive of the portion becomes modified so that adherence is not lowered even by the irradiation of ultraviolet. If such a thing occurs, a portion of the adhesive being left with adherence even through the overheat adheres to the chip during the pickup, which will cause a failure hard to pick up the chip. This failure occurs even in the case where processing by laser beam irradiation is groove formation or where the wafer is full-cut, i.e., fully cut. Incidentally, the alteration and the lowering of the bending strength described above are likely to occur during the full-cut but less frequently occur during the groove formation.

SUMMARY OF THE INVENTION

Accordingly, it is an object of the present invention to provide a laser processing method that can suppress, when a second groove intersecting a first groove is formed by laser beam irradiation, overheat occurring at a portion immediately before the intersection to prevent an failure otherwise caused by the overheat, thereby providing sound products.

In accordance with an aspect of the present invention, there is provided a workpiece laser processing method, the workpiece having a plurality of first predetermined dividing lines extending in a first direction and a plurality of second predetermined dividing lines extending in a second direction intersecting the first predetermined lines. The method includes the steps of: holding the workpiece with holding means; allowing laser beam irradiation means to emit a laser beam with a first power output to each of the first predetermined dividing lines to form a first groove thereon while performing process-transfer along the first predetermined dividing line; and allowing the laser beam irradiation means to emit a laser beam to each of the second predetermined dividing lines to form a second groove thereon while performing process-transfer along the second predetermined dividing line, a power output of the laser beam emitted from the laser beam irradiation means being the first power output until the second predetermined dividing line reaches a predetermined position immediately before the first groove, the laser beam with a second power output lower than the first power output being emitted in an interval from the predetermined position to the first groove.

A "groove," formed in a workpiece, called in the present invention supposes a usual groove which is a void not passing through the workpiece to the rear surface. However, the "groove" includes a slit which is a cut space resulting from subjecting the workpiece to full-cut, i.e., from fully cutting it. In short, the groove of the present invention is a groove or a slit. The workpiece is not restrictive. Examples of the workpiece include wafers such as the semiconductor wafers, adhesion members such as a DAF (Die Attach Film) provided on the rear surface of a semiconductor wafer for chip-mounting, packages of semiconductor products, glass- or silicon-based substrates, and various process materials requiring micron-order accuracy.

In the present invention, in the secondary groove forming step, when a laser beam is emitted along the second predetermined dividing line intersecting the first groove, an output power of the laser beam is allowed to be the first power output until the focal point of the laser beam reaches the predetermined position immediately before the first groove. In addition, the laser beam with the second power output lower than the first power output is emitted in the interval from the predetermined position to the first groove. Because of a short distance from the focal point of the laser beam to the first groove, the interval immediately before the first groove in the second predetermined dividing line becomes hard to dissipate heat caused by the laser beam irradiation to other portions so that it is likely to be overheated. In the past, also the immediately-before-interval has been irradiated with the laser beam with the same power output (the first power output) as that of the interval rearward thereof. However, in the present invention, the immediately-before-interval is irradiated with the laser beam with the second power output lower than the first power output; therefore, overheat can be suppressed. As a result, a failure caused by such overheat can be prevented.

The present invention includes, as the secondary groove forming step, an aspect in which the laser beam emitted along the second predetermined dividing line passes the first groove and intersects the internal surface of the first groove to continuously form the second groove. In this aspect, when the laser beam emitted along the second predetermined dividing line is emitted to a short distant portion immediately after having passed the first groove, the power output of the laser beam may preferably be adjusted to a third power output greater than the first power output. The reason is as below. The portion immediately after the laser beam has passed the first groove in the second predetermined dividing line, i.e., immediately after formation of the second groove is started, does not cause preliminary overheat by the immediately-before-irradiation of laser beam. Therefore, processing energy becomes deficient to cause such a thing that it is difficult to form a groove with accurate depth (a width becomes narrow as indicated with broken lines in FIG. 7). Thus, the short distance portion immediately after the start of groove formation is irradiated with the laser beam with power output higher than the first power output to thereby allow the formation of an appropriate groove.

Preferably, the secondary groove forming step previously obtains temperature variation information of the second predetermined dividing line in an interval from immediately after the laser beam emitted from the laser beam irradiation means to the second predetermined dividing line has passed the first groove, to when reaching a first groove neighboring to the first groove and next intersected thereby. In addition, the second groove forming steps stores, in storage means, output adjustment information used to adjust the power output of the laser beam emitted from the laser beam irradiation means to an appropriate value, on the basis of the temperature variation information. Further, the second groove forming step adjusts the power output of the laser beam emitted from the laser beam irradiation means to the second predetermined dividing means, in accordance with the output adjustment information stored in the storage means. The adoption of this method can automatically perform the appropriate groove formation in accordance with the material of the workpiece.

According to the present invention, when the second groove intersecting the first groove is formed by laser beam irradiation, overheat occurring at the portion immediately before the intersection can be suppressed. This can provide an effect of preventing failures otherwise caused by the overheat, such as abnormal processing, the lowering of bending strength, further the lowering of pickup performance, to thereby provide sound products.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will hereinafter be described with reference to the drawings.

[1] Workpiece

Semiconductor Wafer

Figure 1:
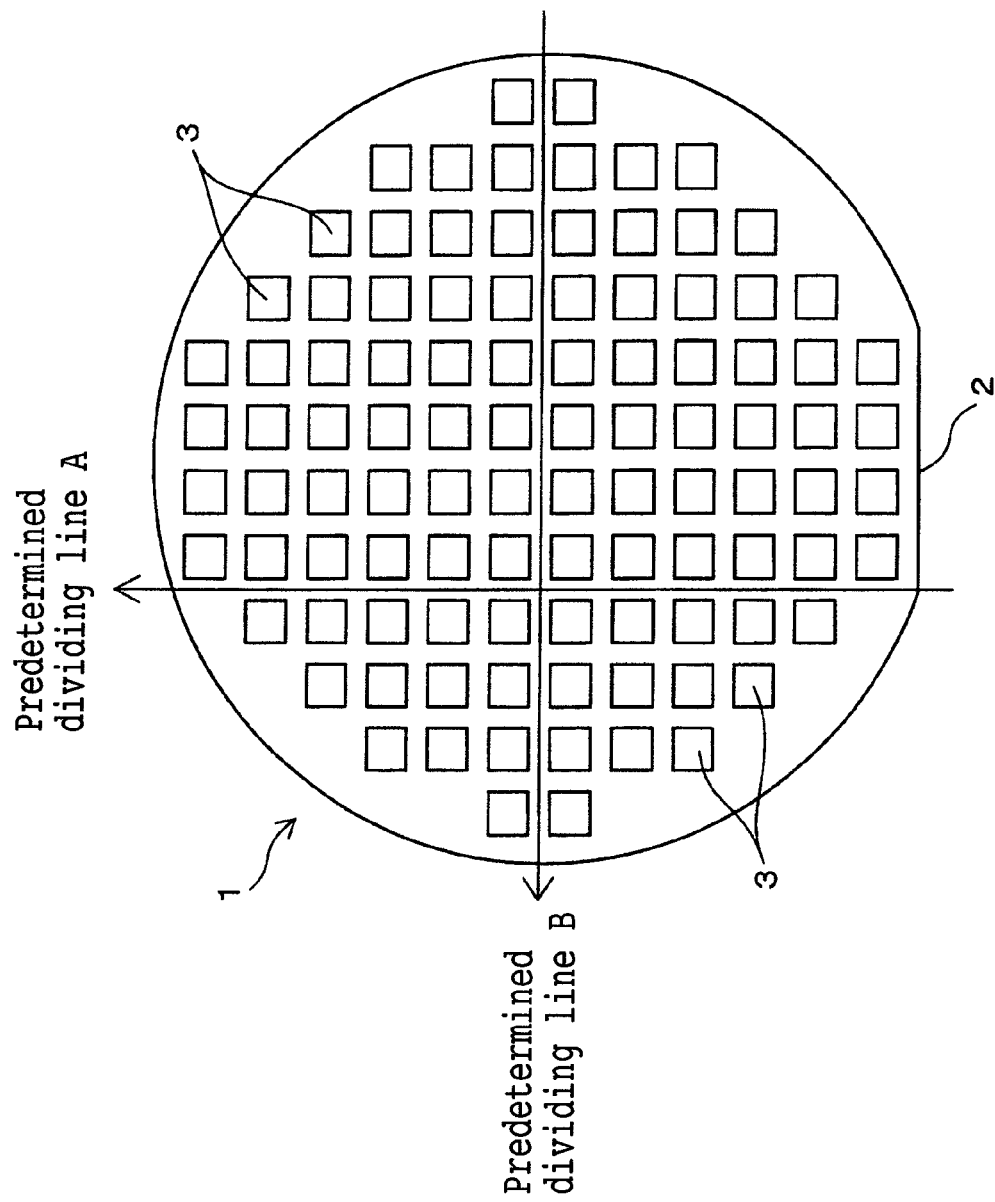
FIG. 1 is a plan view of a semiconductor wafer processed by a method according to an embodiment of the present invention.

FIG. 1 illustrates a thin plate-like workpiece to be processed in the embodiment. This workpiece is a disklike semiconductor wafer (hereinafter, abbreviated as the wafer) made of silicon or the like. The wafer 1 has a thickness of about 200 μm and a diameter of about 200 mm, for example. The wafer 1 is formed with an orientation flat 2 as a mark indicative of crystal orientation at a portion of the outer circumference.

The wafer 1 is formed on a front surface with a plurality of first predetermined dividing lines A extending in a first direction (the up-down direction in FIG. 1) and with a plurality of second predetermined dividing lines B (the left-right direction in FIG. 1) perpendicular to the first predetermined dividing lines A. The predetermined dividing lines A are parallel to and equally-spaced from each other and similarly, the predetermined dividing lines B are parallel to and equally-spaced from each other. In addition, the predetermined dividing lines A, B are arranged in a lattice-like pattern.

The front surface of the wafer is sectioned into a plurality of rectangular chips 3 by the predetermined dividing lines A, B arranged in a lattice-like pattern. The chips 3 are formed with electronic circuits such as ICs, LSIs or the like on the front surfaces. After being subjected to necessary processing such as thinning by rear surface grinding and the like, the wafer 1 is cut along all the predetermined dividing lines A, B for dicing so that the chips 3 are provided as individual divided pieces. Cutting the predetermined dividing lines A, B is performed by forming grooves by laser beam irradiation and then being subjected to full-cut with a blade or by being subjected to full-cut only with laser beam irradiation. The present embodiment adopts a method of forming grooves by irradiating the wafer with a laser beam along the predetermined dividing lines A, B by use of a laser processing apparatus 10 illustrated in FIG. 3.

The laser processing apparatus 10 is configured such that the wafer 1 is horizontally placed on a disklike chuck table 41 with the front surface facing the upside and a laser beam is emitted or directed from a laser head 52 of laser beam irradiation means 50 along the predetermined dividing lines A, B. When being placed on the chuck table 41, the wafer 1 is held by a dicing frame 5 via a dicing tape 4.

The dicing tape 4 is a circular adhesive tape having, for example, a substrate made of polyvinyl chloride with a thickness of about 100 μm and coated on one surface with an acryl resin-based adhesive to a thickness of about 5 μm. The dicing frame 5 is an annular thin-plate member having an inside diameter greater than the diameter of the wafer 1 and made of a rigid material such as metal or the like. In addition, the dicing frame 5 is affixed to the outer circumferential portion of the adhesive surface (the upper surface in FIG. 2) of the dicing tape 4. The wafer 1 is affixed from the rear surface thereof to the central portion of the adhesive surface of the dicing tape 4 and held by the dicing frame 5 via the dicing tape 4. The wafer 1 thus retained by the dicing tape 4 and by the dicing frame 5 is transferred by handling the dicing frame 5 and set in the laser processing apparatus 10. The laser processing apparatus 10 is described below.

[2] Laser Processing Apparatus

The laser processing apparatus 10 includes a base 11. An X-Y traveling table 12 is mounted on the base 11 so as to be movable in horizontal X- and Y-axial directions. The chuck table 41 is mounted on the X-Y traveling table 12. A laser beam is directed from the laser head 52 to the wafer 1 along the predetermined dividing lines A, B along with the X- or Y-axial movement of the X-Y traveling table 12.

The X-Y traveling table 12 is composed of a combination of an X-axial base 20 and a Y-axial base 30. The X-axial base 20 is mounted on the base 11 so as to be movable in the X-axial direction. The Y-axial base 30 is mounted on the X-axial base 20 so as to be moveable in the Y-axial direction. The X-axial base 20 is slidably attached to a pair of parallel guide rails 21 secured to the base 11 so as to extend in the X-axial direction. In addition, the X-axial base 20 is moved in the X-axial direction by an X-axial drive mechanism 24 which operates a ball screw 23 by means of a motor 22. On the other hand, the Y-axial base 30 is slidably attached to a pair of parallel guide rails 31 secured onto the X-axial base 20 so as to extend in the Y-axial direction. In addition, the Y-axial base 30 is moved in the Y-axial direction by a Y-axial drive mechanism 34 which operates a ball screw 33 by means of a motor 32.

A cylindrical chuck base 40 is secured to the upper surface of the Y-axial base 30. The chuck table 41 is supported on the chuck base 40 so as to be rotatable around a Z-axial direction (the up-down direction) as a rotational axis. The chuck table 41 is of such a generally known vacuum chuck type to suck and hold the wafer 1 through vacuum suction operation. In addition, the chuck table 41 is rotated in one direction or in both directions by a rotation drive mechanism not shown accommodated in the chuck base 40. A pair of clamps 42 are arranged on the circumference of the chuck table 41 at respective positions apart 180° from each other so as to detachably hold the dicing frame 5. The clamps 42 are attached to the chuck base 40.

In the X-Y traveling table 12 of this case, the X-directional movement of the X-axial base 20 is defined as a processing-transfer direction in which a laser beam is directed along the predetermined dividing line A or B. The Y-axial movement of the Y-axial base 30 is defined as an indexing direction in which the predetermined dividing lines A, B subjected to laser beam irradiation are switched. Incidentally, the processing-transfer direction and the indexing direction may reversely be set, that is, may be set such that the Y-axial direction is the processing-transfer direction and the X-axial direction is the indexing direction. In short, the processing-transfer direction and the indexing direction are not restrictive.

A description is next given of the laser beam irradiation means 50. The laser beam irradiation means 50 includes a casing 51 shaped in a rectangular parallelepiped extending in the Y-axial direction toward above the chuck table 41. The laser head 52 is provided at the leading end of the casing 51. The casing 51 is attached to a column 13 so as to be movable upward and downward along the vertical direction (the Z-axial direction). The column 13 is provided on the upper surface of the base 11 so as to extend upward. In addition, the casing 51 is moved upward and downward by a vertical drive mechanism not shown accommodated in the column 13.

Figure 4:
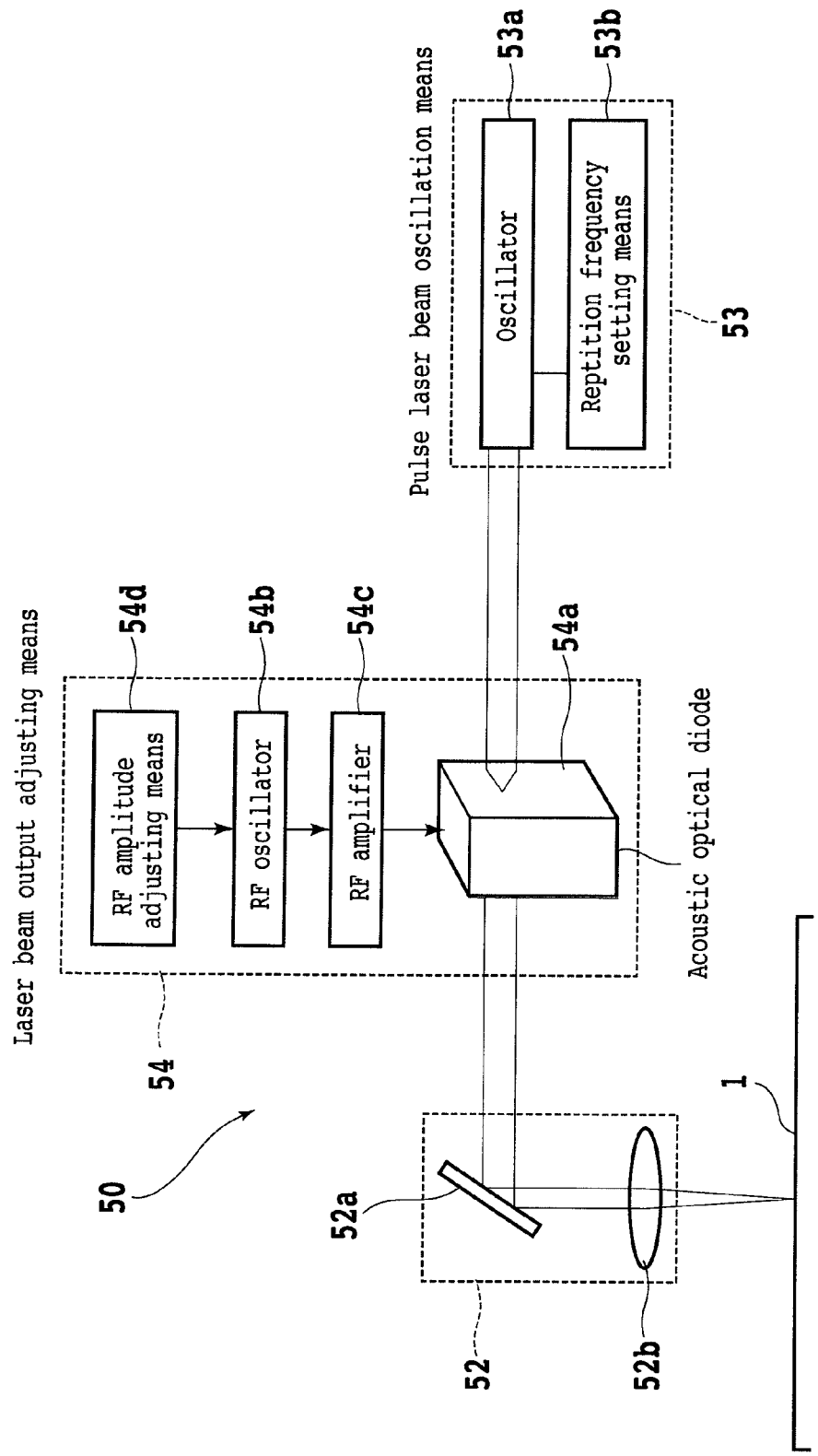
FIG. 4 is a block diagram illustrating a configuration of laser beam irradiation means equipped by the laser processing apparatus.

Referring to FIG. 4, the laser beam irradiation means 50 includes, in the casing 51, pulse laser beam oscillation means 53 and a laser beam output adjusting means 54, as constituent elements. The laser beam output adjusting means 54 adjusts the power output (pulse energy) of the laser beam oscillated by the pulse laser beam oscillation means 53. The pulse laser beam oscillation means 53 includes a pulse laser beam oscillator 53a composed of a YAG laser oscillator or a YVO4 laser oscillator. Repetition frequency setting means 53b is attached to the pulse laser beam oscillator 53a.

The laser beam output adjusting means 54 includes an acoustic optic diode (hereinafter called the AOD) 54a for adjusting the power output of the laser beam oscillated by the laser beam oscillation means 53; an RF oscillator 54b for producing RF (Radio Frequency) applied to the AOD 54a; an RF amplifier 54c for amplifying the power of the RF produced by the RF oscillator 54b and applying it to the AOD 54a; and RF amplitude adjusting means 54d for adjusting the amplitude of the RF produced by the RF oscillator 54b. In the laser beam output adjusting means 54, the power output of the laser beam is adjusted in accordance with the amplitude of the RF applied to the AOD 54*a*. The RF amplitude adjusting means 54*d* is controlled by control means 70 described later. As shown in FIG. 4, the laser head 52 includes a mirror 52*a* adapted to divert downward the pulse laser beam horizontally passing through the AOD 54*a*; and a lens 52*b* adapted to collect the laser beam diverted by the mirror 52*a*.

Figure 3:
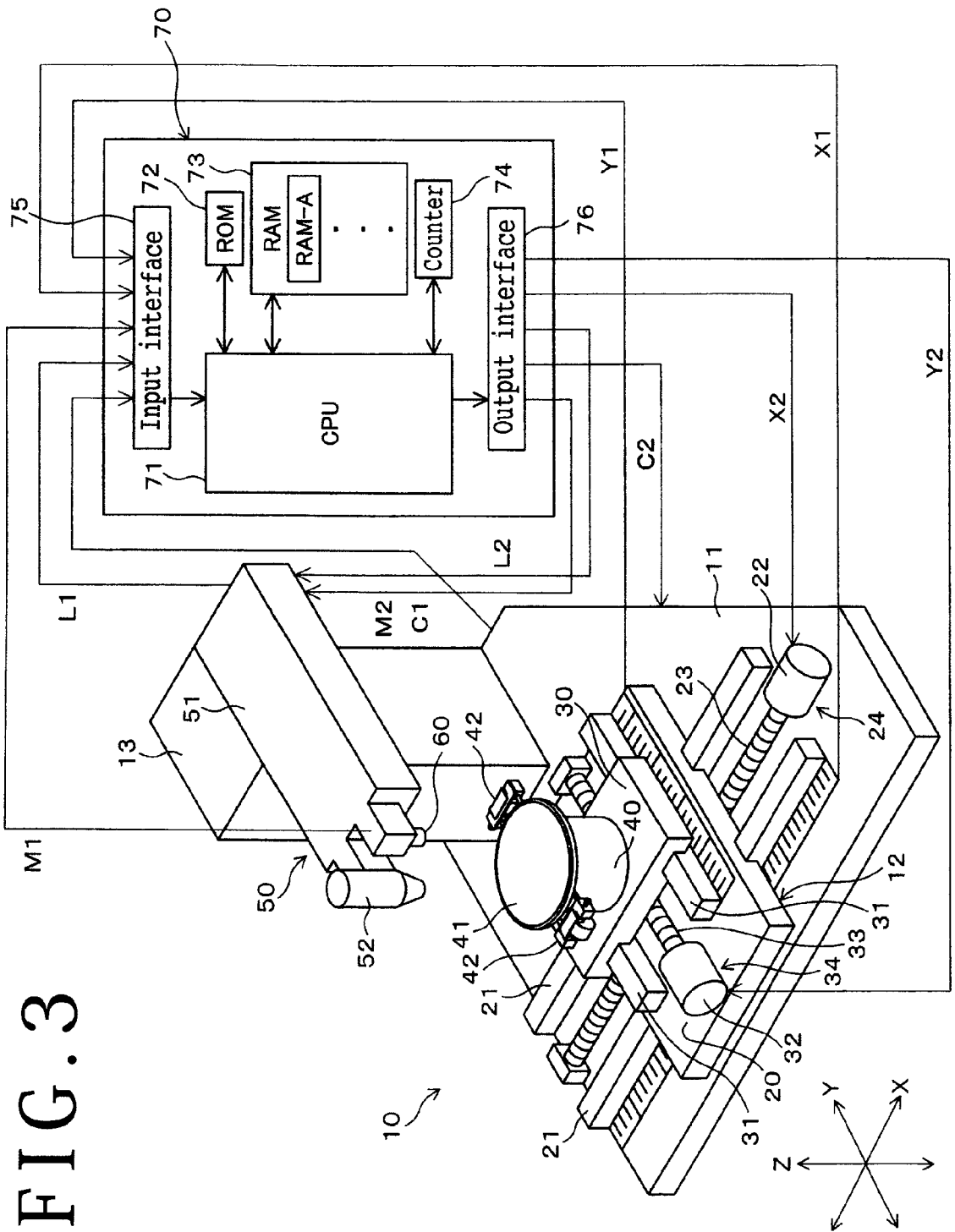
FIG. 3 is a perspective view of a laser processing apparatus suitable for performing the method of the embodiment.

As shown in FIG. 3, imaging means 60 is disposed at the leading end of the casing 51 and adjacent to the laser head 52. The imaging means 60 images and detects an irradiation area of a laser beam emitted from the laser head 52. In addition, the imaging means 60 includes illumination means for illuminating a workpiece (the wafer herein) placed on the chuck table 41; an optical system; and an imaging element composed of a CCD adapted to pick up an image captured by the optical system. The image information picked up by the imaging means 60 is supplied to the control means 70.

The control means 70 is composed of a computer and includes a CPU (central processing unit) 71 adapted to execute computation in accordance with a control program; a ROM (read only memory) 72 for storing the control program; a readable and writable RAM (random access memory) for storing the type of the wafer, calculations and the like; a counter 74; an input interface 75; and an output interface 76.

The CPU 71 of the control means 70 receives, via the input interface, information X1 of a processing-transfer amount based on the positional information of the X-axial base 20; information Y1 of an indexing-transfer amount based on the positional information of the Y-axial base 30; rotational angle information C1 of the chuck table 41; laser beam irradiation information L1 of the laser beam irradiation means 50; and image information M1 from the imaging means 60. The CPU 71 supplies, via the output interface 76, control signals X2, Y2, C2, L2, and M2 to the motor 22 adapted to move the X-axial base 20, the motor 32 adapted to move the Y-axial base 30, drive sources such as a motor equipped by the rotational drive mechanism of the chuck table 41, the laser beam irradiation means 50, and the imaging means 60, respectively.

[3] Operation of the Laser Processing Apparatus and Groove Forming Method

A description is next given of an example of allowing the laser processing apparatus 10 to execute a groove forming method according to the laser processing method of the present invention. The operation of groove formation is controlled by the control means 70.

Figure 2:
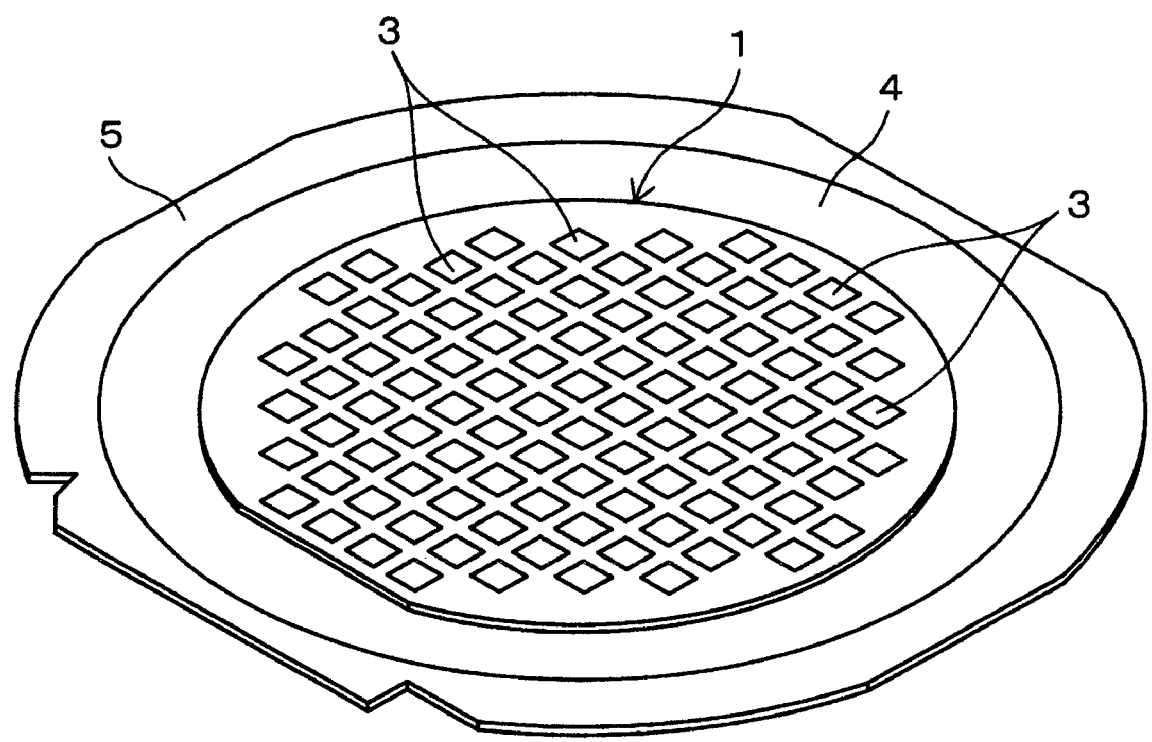
FIG. 2 is a perspective view illustrating the semiconductor wafer shown in FIG. 1 with the wafer held by a dicing frame via a dicing tape.

As shown in FIG. 2, the wafer 1 held by the dicing frame 5 via the dicing tape 4 is concentrically placed on the vacuum-operating chuck table 41 with the front surface formed with the chips 3 facing upside, and is sucked and held by vacuum suction operation. In addition, the dicing frame 5 is held by the clamps 42.

Next, the wafer 1 is moved to a position immediately below the imaging means 60 by appropriately moving the X-Y traveling table 12 in the X- and Y-axial directions. Thus, the wafer 1 is positioned so that the overall front surface of the wafer 1 may fall within the imagine range of the imaging means 60. The front surface of the wafer 1 is picked up by the imaging means 60. While performing image processing such as pattern matching based on the predetermined dividing lines A, B of the front surface picked up, the control means 70 performs alignment work. In the alignment work, the chuck table 41 is turned to set a predetermined dividing line (a predetermined dividing line A herein) on the side where a groove is first formed, parallel to the processing-transfer direction (the X-direction). Along with the alignment work, the control means 70 recognizes the coordinates of the predetermined dividing lines A, B on coordinates owned by the control means 70 itself and creates and stores operation date necessary for processing. Next, the wafer 1 is subjected to a primary groove forming step and to a secondary groove forming step as described below.

[3-1] Primary Groove Forming Step (Formation of Groove on the Predetermined Dividing Line A)

The X-axial base 20 is moved in the X-axial direction to locate the wafer 1 at a position offset in the X-axial direction from the focal point of the laser beam emitted from the laser head 52. In addition, the Y-axial base 30 is moved in the indexing direction (the Y-axial direction) to allow the Y-axial directional position of one predetermined dividing line A to coincide with the focal point of the laser beam. In short, the indexing is performed. Further, the up-down position of the casing 51 is adjusted to locate the focal point of the laser beam emitted from the laser head 52 at a position where a groove with a predetermined depth is formed in the predetermined dividing line A.

Subsequently, processing-transfer is performed in which the X-axial base 20 is moved in a direction where the wafer 1 moves toward the laser head 52. During the processing-transfer, one predetermined dividing line A passes the focal point of the laser beam. While the predetermined dividing line A passes the focal point of the laser beam during the processing-transfer as described above, a laser beam is emitted from the laser head 52. The irradiation of the laser beam forms a groove (a first groove G1, see FIG. 5) with a predetermined depth along the predetermined dividing line A.

Next, the Y-axial base 30 is moved in the indexing direction to perform indexing. In the indexing, the Y-axial directional position of a predetermined dividing line A adjacent to the predetermined dividing line A previously formed with the first groove G1 is allowed to coincide with the focal point of the laser beam. Subsequently, while the wafer 1 is processing-transferred, the next predetermined dividing line A is irradiated with a laser beam to form the next first groove G1. As described above, the operation in which the indexing is executed between the reciprocative processing-transfers is performed to move the wafer 1 in zigzags. During this process, the predetermined dividing lines A are irradiated with the laser beam. In this way, all the predetermined dividing lines A are irradiated with the laser beam to form a plurality of the first grooves G1.

The power output of the laser beam encountered when the first groove G1 is formed is adjusted in amplitude by the RF amplitude adjusting means 54*d* of the laser beam output adjusting means 54 to adjust the power output of the laser beam passing the AOD 54*a*. In this case, the first groove G1 is formed by the laser beam with a power output directed to the predetermined dividing line A, the power output being made constant and defined as "a first power output."

[3-2] Secondary Groove Forming Step (Formation of a Groove on the Predetermined Dividing Line B)

After the first groove G1 has been formed on all the predetermined dividing lines A, and alignment work is performed in which the chuck table 41 is rotated by 90° and the predetermined dividing lines B are set parallel to the X-direction. Thereafter, a groove (a second groove G2, see FIG. 5) is formed on all the second predetermined dividing lines B by similarly performing the operation of forming the first groove G1 on all the first predetermined dividing lines A. When the second groove G2 is formed, the laser beam is directed to cross the plurality of first grooves G1 formed in the primary groove forming step. In the present embodiment, the laser beam irradiation on the secondary predetermined dividing line 2 is performed as below.

Figure 5:
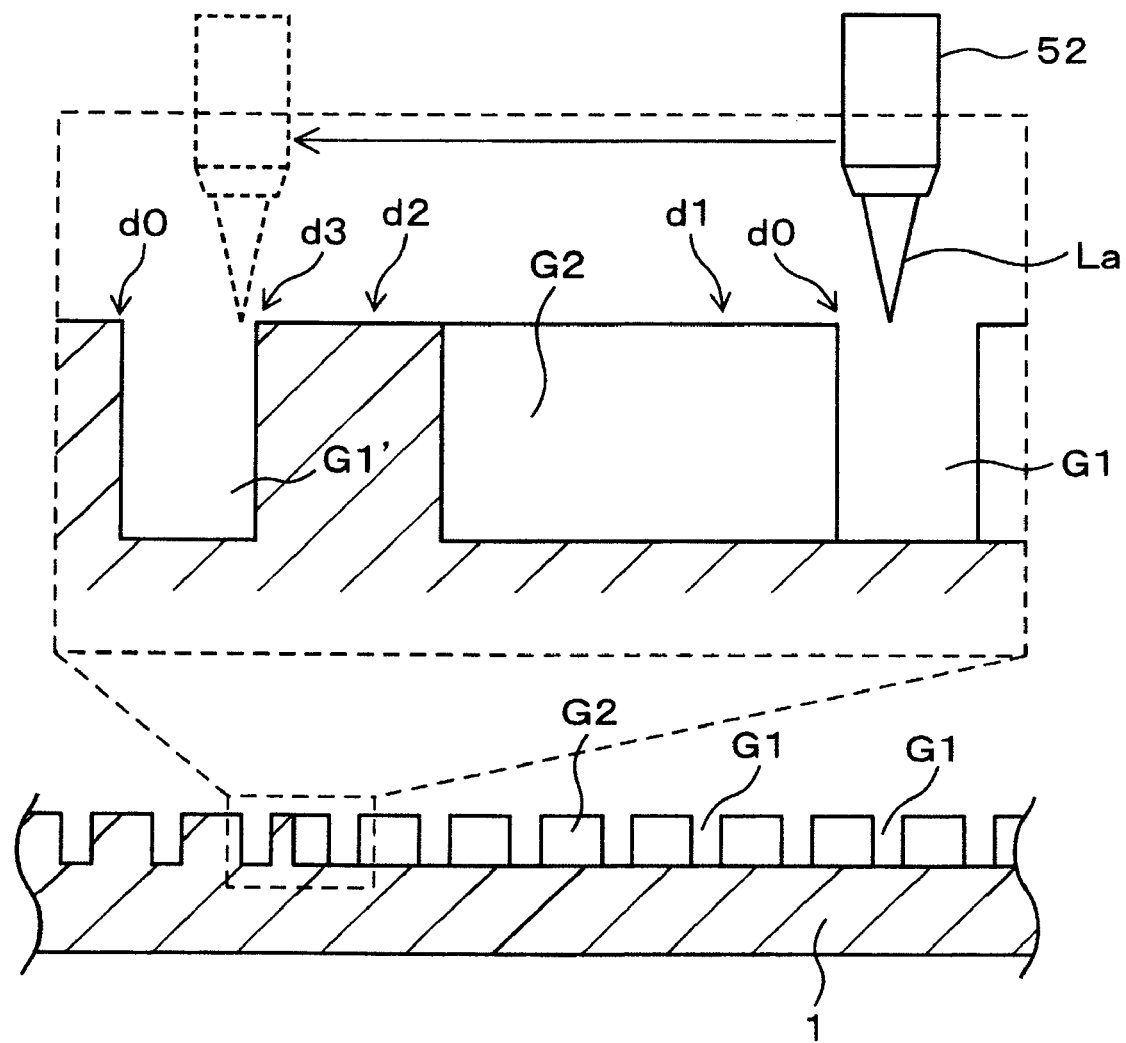
FIG. 5 is a cross-sectional view illustrating a state of irradiating a second predetermined dividing line with a laser beam.

As shown in FIG. 5, in an interval d0 to d2, a laser beam La is emitted at a first power output that is the same power output as when the first groove G1 (including G1') is formed. The interval d0 to d2 is from a starting point d0 immediately after the focal point of the laser beam La relatively moved along the second predetermined dividing line B has passed the first groove G1, to a position immediately before it reaches a first groove G1 to be next crossed. In a short interval d2 to d3 from a position d2 to a terminal point d3 where the focal point of the laser beam La reaches the next first groove G1', the laser beam La is emitted at "a second power output" lower than the first power output. When the next starting point d0 is irradiated after the focal point of the laser beam has passed the first groove G1', the power output of the laser beam is returned to the first power output.

In the secondary groove forming step as described above, in the interval where the second groove G2 is formed (between the adjacent first grooves G1), the laser beam is directed along the predetermined dividing line B while repeating output adjustment of making the power output of the laser beam relatively stronger and weaker. Incidentally, while the laser beam passes the first groove G1, its power output may be returned to the first power output or may be the second power output as it is.

Now, the conditions of the laser beam emitted to form the grooves are quoted as follows:

Light source . . . LD excitation Q switch Nd: YV04
Wavelength . . . 355 nm
Repetition frequency . . . 50 kHz
First power output (pulse energy) . . . average 8 W
Second power output (pulse energy) . . . average 6 W
Light focus spot diameter . . . $\phi$15 µm
Processing-transfer rate . . . 200 mm/sec The chip 3 is a square one side of which has a length of about 5 mm. The grooves G1, G2 each have a width of about 25 µm and a depth of about 20 µm.

[4] Dicing Step

All the predetermined dividing lines B are irradiated with the laser beam to finish the secondary groove forming step before the groove formation on the wafer 1 is completed. Thereafter, the first grooves G1 and the second grooves G2 are subjected to e.g. blade dicing to completely cut each of the predetermined dividing lines A, B, whereby the wafer 1 is divided into individual chips 3. The blade dicing is performed after the wafer 1 is removed from the chuck table 41 along with the dicing frame 5 and set in a blade dicing device. After the dicing of the wafer 1 is completed, the chips 3 are each peeled from the dicing tape 4 by the pickup device. Thus, a plurality of the chips 3 can be provided.

[5] Function and Effect of the Embodiment

According to the present embodiment described above, in the secondary groove forming step, the interval d2 to d3 immediately before reaching the first groove G1 is irradiated with the laser beam with the power output (the second power output) lower than that for the interval d0 to d2 immediately before the interval d2 to d3. Because of the short distance from the focal point of the laser beam to the first groove G1, it is difficult to diffuse heat caused by the laser beam irradiation to other portions so that the interval d2 to d3 tends to be overheated. Also the interval d2 to d3 has been irradiated with the laser beam of the same power output as the interval d0 to d2 rearward thereof; therefore, an influence due to the overheat has occurred. However, in the present embodiment, the interval d2 to d3 is irradiated with the laser beam with the second power output lower than the first power output; therefore, overheat can be suppressed. Consequently, failures caused by the overheat can be prevented. Incidentally, the failures include deformation of a chip due to the enlarged width of the second groove G2 in the interval d2 to d3 and the occurrence of cracks and damage due to the loss of bending stress. In addition, the deformation of the chip 3 and the loss of the bending strength more significantly occur during fullcut than during the groove formation. Therefore, it is particularly effective to adjust the power output during the full-cut.

If the dicing tape 4 used in the embodiment uses a ultraviolet cure adhesive, during the pick-up of the chip 3, the adhesive is irradiated with ultraviolet to lower its adherence, thereby making it easy to peel off the chip 3 from the dicing tape 4. The ultraviolet cure adhesive is overheated to become modified, which causes a failure in which even the irradiation of ultraviolet will not lower adherence. However, in the embodiment as described above, the power output of the laser beam is adjusted to suppress the overheat of the portion (the periphery of the interval d2 to d3) that has otherwise been overheated. Therefore, the chip 3 is smoothly peeled off from the dicing tape 4, that is, the easiness of pick-up by use of the ultraviolet cure adhesive can be ensured.

Incidentally, the following is a preferable method. The power output of the laser beam La is adjusted to a power output (a third power output) higher than the first power output in the short interval d0 to d1 from the starting point d0 immediately after the laser beam has passed the first groove G1 shown in FIG. 5 in irradiating the predetermined dividing line B with the laser beam. The adoption of this method can make a failure such as a reduction in depth and width of the groove of the interval d0 to d1 less likely to occur, for formation of an appropriate groove. Such a failure occurs because preliminary overheat resulting from the preceding laser beam irradiation has not been generated so that processing energy is deficient.

[6] Another Embodiment

In embodiment described above, the power output of the laser beam is simply adjusted to such two stages, i.e., to the first power output in the interval d0 to d2 after the laser beam has passed the first groove G1 and to the second power output lower than the first power output in the interval d2 to d3 immediately before the next first groove G1'. In the present invention, however, as long as the condition is satisfied that the power output of the interval d2 to d3 is lower than the interval d0 to d2, the power output may be adjusted so that it is not constant in each of the intervals and gradually lowers from the starting point d0 to the terminal point d3.

For such output adjustment, a mode for adjusting a power output in accordance with temperature variations as described below is practically effective. Specifically, a laser beam with the first power output is emitted from the starting point d0 to the terminal point d3. In this case, temperature at a tip portion of the second groove G2 thus formed is continuously measured. The temperature variation information is preliminarily obtained and stored in the RAM 73 of the control means 70. Based on the temperature variation information, the control means 70 creates output adjustment information used to adjust the power output of the laser beam to an appropriate value to form the second groove G with constant depth and width without the occurrence of overheat. Also this output adjustment information is stored in the RAM 73. The power output of the laser beam directed from the laser beam irradiation means 50 to the second predetermined dividing line B is adjusted in accordance with the output adjustment information thus stored.

The appropriate groove formation can be performed by adjusting the power output of the laser beam in accordance with the temperature variation information as described above. The temperature variation information is different depending on the materials of a workpiece (the wafer 1 in the embodiment). The temperature variation information is obtained for each workpiece, the output adjustment information of a laser beam according to the temperature variation information is created, and both are stored. This provides an advantage capable of dealing with a plurality of workpieces.

The embodiments of the present invention are as above. The groove formation by the laser beam irradiation in the present invention includes full-cut in which the workpiece is cut so as to be fully passed therethrough, as well as a common groove in which the workpiece is not fully passed therethrough. The semiconductor 1 in the embodiment is a workpiece. However, the workpiece of the invention is not limited to a semiconductor wafer and variously targets adhesion members such as a DAF (Die Attach Film) provided on the rear surface of a semiconductor wafer for chip-mounting, packages of semiconductor products, glass- or silicon-based substrates, and various process materials requiring micron-order accuracy.

Next, the effects of present invention are demonstrated by presenting a comparative example other than the present invention and a practical example of the present invention.

Comparative Example

Figure 6:
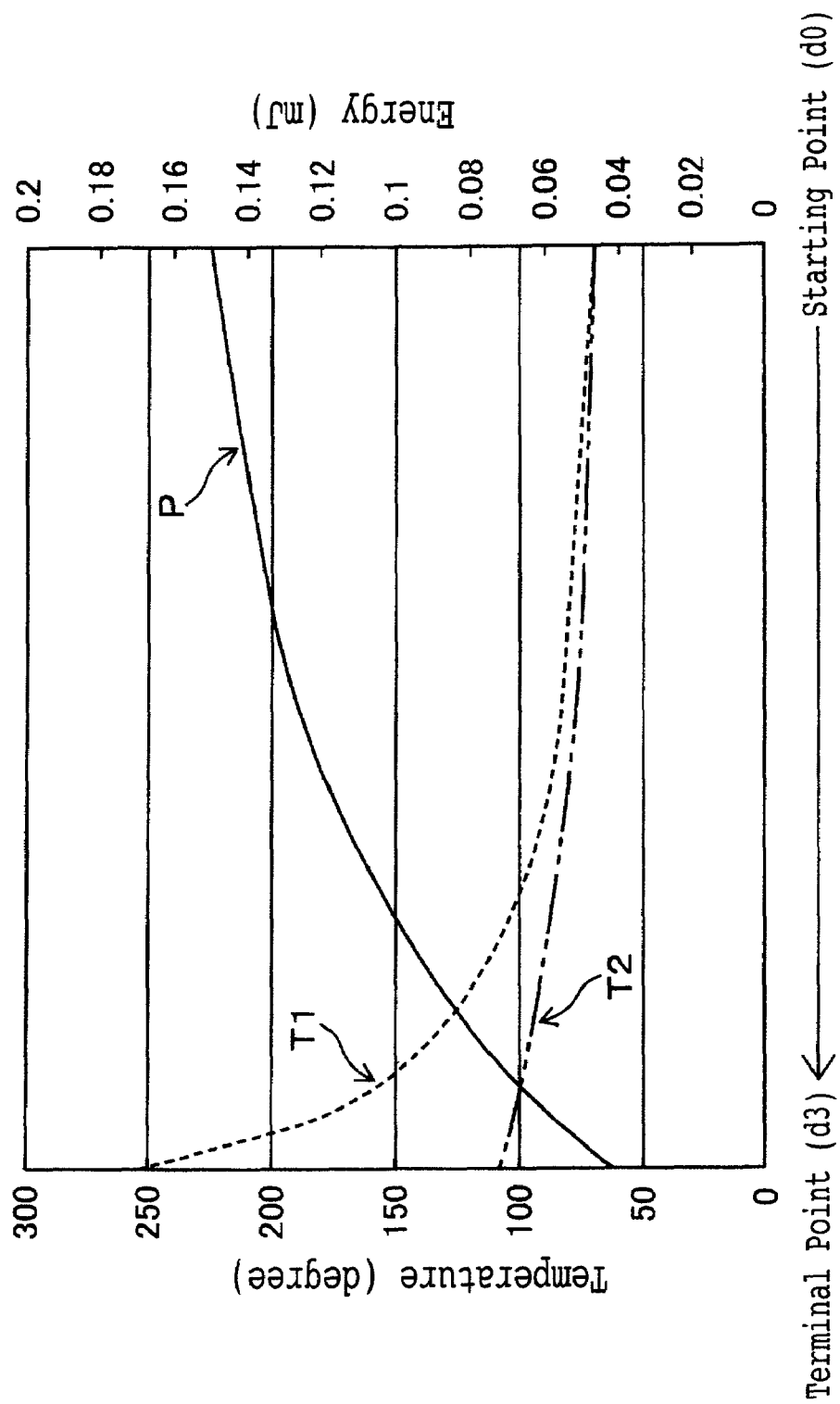
FIG. 6 is a diagram illustrating a temperature variation measurement value at a tip portion of a second groove, measured in the embodiment, an adjustment value of a laser beam irradiation output based on the temperature variation measurement value, and a temperature variation measurement value encountered when the second groove is formed in accordance with the laser beam irradiation output adjustment value.
Figure 7:
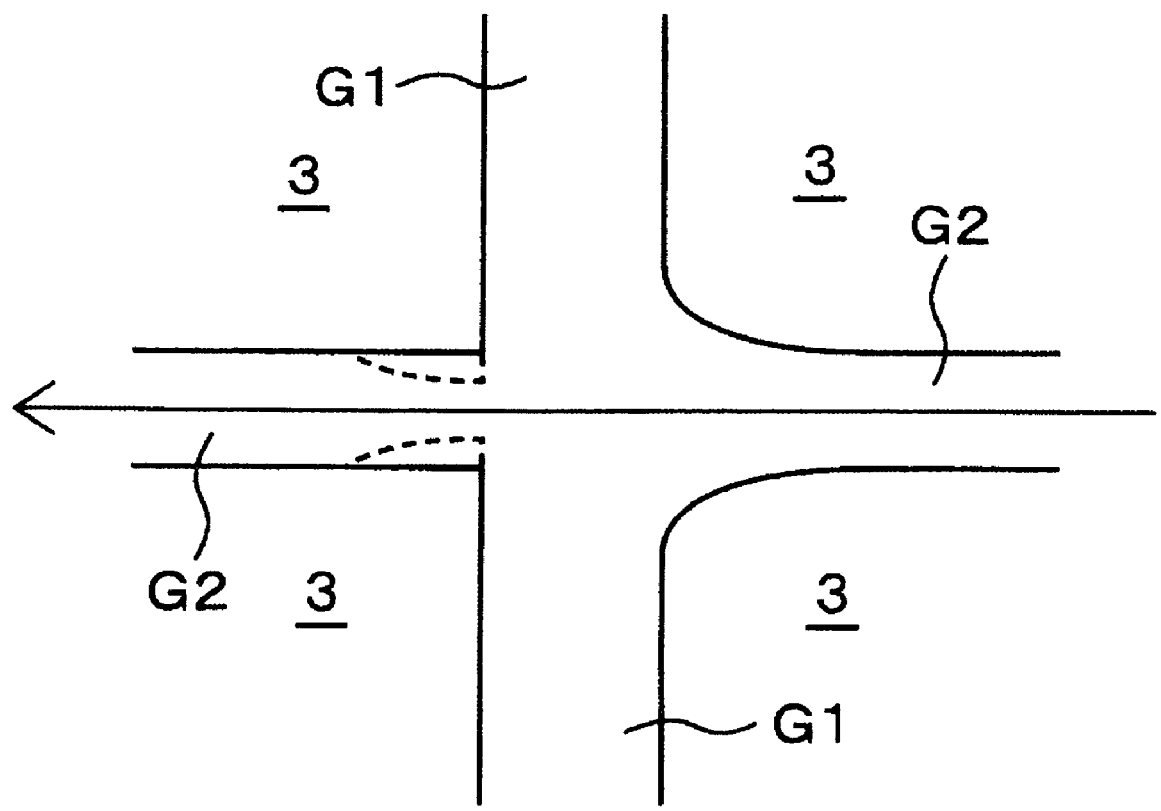
FIG. 7 is a plan view illustrating a state of chips in the vicinity of an intersecting point between a first groove and a second groove in the case where the second groove is formed with a laser beam output conventionally set constant.

A silicon wafer was affixed to an ultraviolet cure dicing tape (made by Lintec Corporation: D650). This silicon wafer has a thickness of about 700 μm and is formed with lattice-like predetermined dividing lines A, B to provide chips each of which has one side with about 5 mm in length. The dicing tape was affixed to a dicing frame. The silicon wafer was set in the laser processing apparatus as shown in FIG. 3 along with the dicing frame. The predetermined dividing lines A, B were irradiated with a laser beam at a constant power output under the following conditions to form grooves. When a second predetermined dividing line B was irradiated with a laser beam to form a second groove, temperature at a tip portion of the groove was continuously measured from a starting point to a terminal point of the groove by 1 μm. Line T1 in FIG. 6 is obtained by continuously plotting such temperature measurement values. After the grooves were formed on the predetermined dividing lines A, B, the predetermined dividing lines A, B were completely cut by blade dicing to dice the wafer into a plurality of individual chips.

Light source . . . LD excitation Q switch Nd: YVO4

Wavelength . . . 355 nm

Repetition frequency . . . 50 kHz

Power output (pulse energy) . . . 8 W

Light focus spot diameter . . . φ15 μm

Processing-transfer rate . . . 200 mm/sec

Subsequently, the dicing tape was irradiated with ultraviolet before the chips were obtained by picking them up from the dicing tape. When the chips were picked up, stress required to fully peel off the chip from the adhesive surface of the dicing tape was measured.

Practical Example

A wafer was subjected to dicing under the same conditions as those of the comparative example except the power output of a laser beam directed to the second predetermined dividing lines B, thus providing chips. The power output of the laser beam in the practical example was as below. The output variation values of the laser beam adapted to make appropriate the width and depth of the second groove formed from a starting point to a terminal point (corresponding to the interval d0 to d3 in FIG. 5), i.e., output adjustment information (line P of FIG. 6), was calculated on the basis of the temperature measurement values T1 measured in the comparative example with respect to the tip portion of the second groove. The laser beam was directed to the second predetermined dividing line B to form the second groove while varying the power output from the starting point to the terminal point. Incidentally, when the second groove was formed, the temperature at the tip portion of the groove was continuously measured similarly to the comparative example. Line T2 in FIG. 6 is obtained by continuously plotting the temperature measurement values.

Comparison Between the Comparative Example and the Practical Example

It is assumed that stress (pickup stress) required to pick up a chip obtained under the same manufacturing conditions as those of the comparative example except that the semiconductor wafer is full-cut only by a cutting blade is "1." In this case, the pickup stress of the comparative example is "2," whereas the pickup stress of the practical example is "1.4." This result shows that the practical example suppresses the alteration of the ultraviolet cure dicing tape due to thermal influence and smoothly lowers the adhesion of the dicing tape through ultraviolet irradiation. As shown in FIG. 6, it is seen that if the power output of the laser beam is constant, temperature abruptly rises in an interval immediately before the first groove (T1) to cause an overheat state. In addition, it is seen that verifying the power output of the laser beam based on the temperature information of T1 as shown with symbol P suppresses the significant temperature rise in the interval immediately before the first groove (T2) to prevent the occurrence of overheat.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece laser processing method, the workpiece having a plurality of first predetermined dividing lines extending in a first direction and a plurality of second predetermined dividing lines extending in a second direction intersecting the first predetermined lines, the method comprising the steps of:

holding the workpiece with holding means;

allowing laser beam irradiation means to emit a laser beam with a first power output to each of the first predetermined dividing lines to form a first groove thereon while performing process-transfer along the first predetermined dividing line; and allowing the laser beam irradiation means to emit a laser beam to each of the second predetermined dividing lines to form a second groove thereon while performing process-transfer along the second predetermined dividing line, a power output of the laser beam emitted from the laser beam irradiation means being the first power output until the second predetermined dividing line reaches a predetermined position immediately before the first groove, the laser beam with a second power output lower than the first power output being emitted in an interval from the predetermined position to the first groove.

2. The workpiece laser processing method according to claim 1, wherein the second groove forming step includes a sub-step of adjusting the power output of the laser beam to a third power output greater than the first power output in a portion immediately after the laser beam emitted from the laser beam irradiation means to the second predetermined dividing line has passed the first groove.

3. The workpiece laser processing means according to claim 1, wherein the second groove forming step includes the sub-steps of:

previously obtaining temperature variation information of the second predetermined dividing line in an interval from immediately after the laser beam emitted from the laser beam irradiation means to the second predetermined dividing line has passed the first groove, to when reaching a first groove neighboring to the first groove and next intersected;

storing, in storage means, output adjustment information used to adjust the power output of the laser beam emitted from the laser beam irradiation means to an appropriate value, on the basis of the temperature variation information; and adjusting the power output of the laser beam emitted from the laser beam irradiation means to the second predetermined dividing means, in accordance with the output adjustment information stored in the storage means.

* * * * *